United States Patent
Ong et al.

(10) Patent No.: US 7,915,907 B2
(45) Date of Patent: Mar. 29, 2011

(54) FAULTY DANGLING METAL ROUTE DETECTION

(75) Inventors: Hui Peng Ong, Penang (MY); Chun Keong Lee, Perak (MY); Gregory Sylvester Emmanuel, Penang (MY)

(73) Assignee: Spansion LLC, Sunnyvale, CA (US)

( * ) Notice: Subject to any disclaimer, the term of this patent is extended or adjusted under 35 U.S.C. 154(b) by 119 days.

(21) Appl. No.: 11/767,620

(22) Filed: Jun. 25, 2007

(65) Prior Publication Data

US 2008/0315906 A1 Dec. 25, 2008

(51) Int. Cl.
*G01R 31/26* (2006.01)
(52) U.S. Cl. .................................. 324/762.01
(58) Field of Classification Search ............... 324/158.1, 324/500–501, 750–765; 438/14–18; 257/48; 702/81–84; 700/95, 110, 121
See application file for complete search history.

(56) References Cited

U.S. PATENT DOCUMENTS

| | | | |
|---|---|---|---|
| 4,801,869 A * | 1/1989 | Sprogis | 714/733 |
| 5,699,282 A * | 12/1997 | Allen et al. | 702/85 |
| 6,020,746 A * | 2/2000 | Livengood | 324/754 |
| 6,268,717 B1 * | 7/2001 | Jarvis et al. | 324/158.1 |
| 6,448,098 B1 * | 9/2002 | Milor | 438/17 |
| 6,536,007 B1 * | 3/2003 | Venkataraman | 714/724 |
| 6,738,954 B1 * | 5/2004 | Allen et al. | 716/4 |
| 6,943,559 B2 * | 9/2005 | Yamaoka et al. | 324/537 |
| 7,053,645 B2 * | 5/2006 | Chung | 324/764 |
| 7,067,335 B2 * | 6/2006 | Weiner et al. | 438/16 |
| 7,176,675 B1 * | 2/2007 | Liegl | 324/158.1 |
| 7,346,878 B1 * | 3/2008 | Cohen et al. | 716/11 |
| 7,474,107 B2 * | 1/2009 | Patterson et al. | 324/751 |
| 7,486,097 B2 * | 2/2009 | Liegl | 324/765 |
| 2004/0164755 A1 * | 8/2004 | Yamaoka et al. | 324/754 |
| 2004/0246015 A1 * | 12/2004 | Chung | 324/764 |
| 2006/0054816 A1 * | 3/2006 | Bullock | 250/310 |

* cited by examiner

*Primary Examiner* — Ha Tran T Nguyen
*Assistant Examiner* — Joshua Benitez
(74) *Attorney, Agent, or Firm* — Turocy & Watson, LLP

(57) ABSTRACT

A system is provided that facilitates locating long dangling metal routes in a semiconductor chip design. The system includes mechanisms for partitioning metal features of the chip design to discover dangling metal routes that could be potential violations. The system further comprises mechanisms for determining if the dangling metal routes of the chip design exceed a length limit that could result antenna violations, undesired noise in the circuit, circuitry breakdown or the like. The system enables excessively long dangling metal routes to be allowed as exceptional cases. Machine learning is provided to receive feedback to refine the exceptional cases and enable more efficient fault detection.

20 Claims, 10 Drawing Sheets

FAULTY DANGLING METAL ROUTE DETECTION

BACKGROUND

In the semiconductor industry, there is a trend to fabricate higher device densities. To achieve higher and higher densities per chip, efforts continue to scale down device dimensions (e.g., at submicron levels) on semiconductor wafers. For example, smaller and smaller feature sizes are being fabricated on integrated circuits (ICs) within small rectangular portions of the wafer, commonly known as dies. Examples of such features include width and spacing of interconnecting lines, spacing and diameter of contact holes and surface geometry such as corners and edges. In order to scale down device dimensions, precision control of the fabrication process is required. The dimension of and between features typically is referred to as critical dimensions or CD. Reducing CDs and reproducing more accurate CDs facilitates achieving higher device densities through scaled down dimensions and increased packing.

The process of manufacturing semiconductors or ICs typically includes numerous steps (e.g., exposing, baking, developing, etc.), during which hundreds of copies of an integrated circuit can be formed on a single wafer, and more particularly on each die of the wafer. In many of these steps, material is overlayed or removed from existing layers at specific locations to form desired elements of the integrated circuit. Generally, the manufacturing process involves creating several patterned layers on and into a substrate that ultimately forms the complete integrated circuit. This layering process creates electrically active regions in and on the semiconductor wafer surface. A The design of complex semiconductors or ICs can be a difficult task and errors in design can result in silicon failure or re-masking during fabrication. Many of these errors can be spotted in the semiconductor or IC design before the design is taped-out or released to fabrication. Bad design practices resulting in errors can produce a bad silicon chip in fabrication even when the errors can be identified prior to fabrication. However, manually checking the design is a time consuming task even when the errors are easily noticed. For example, a flash memory design can have several million transistors that will need to be reviewed. In the case of modern central processing units (CPUs), the transistor count can be as high as several hundreds of millions transistors. Accordingly, the difficult task of manual review could result in errors going unnoticed during design.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The subject matter disclosed and claimed herein, in one aspect thereof, comprises a system that facilitates efficient identification of design faults in a semiconductor chip design resulting from bad design practices. In particular, the system facilitates detection of long dangling metal routes that exceed a pre-described threshold. The system comprises a partition component and an analysis component. The partition component focuses on metal layers of the semiconductor chip design. The partition component scans the metal layers and separates metal-on-metal features based at least upon the intersection with metal vias or contacts. The partition component locates dangling metal routes (i.e. metal routing left dangling beyond an intersection with a via or contact) that could be areas containing potential faults.

The analysis component compares the length of the dangling metal routes with the pre-described threshold. An error is probable if the dangling metal route exceeds the threshold except in some special cases. The analysis component checks the metal route a second time to verify if any exceptions are applicable and, if not, flags the metal route as a real error. The analysis component continues this process on all dangling metal routes present in the semiconductor chip design. A report file is generated identifying all real errors detected by the analysis component.

In accordance with another aspect of the subject disclosure, a learning component is utilized to receive feedback from design engineers reviewing the report file. The feed back information is utilized by the learning component to update, refine and improve the exceptions. Accordingly, the system adapts to more efficiently detect true dangling metal route errors.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DETAILED DESCRIPTION

Figure 1:
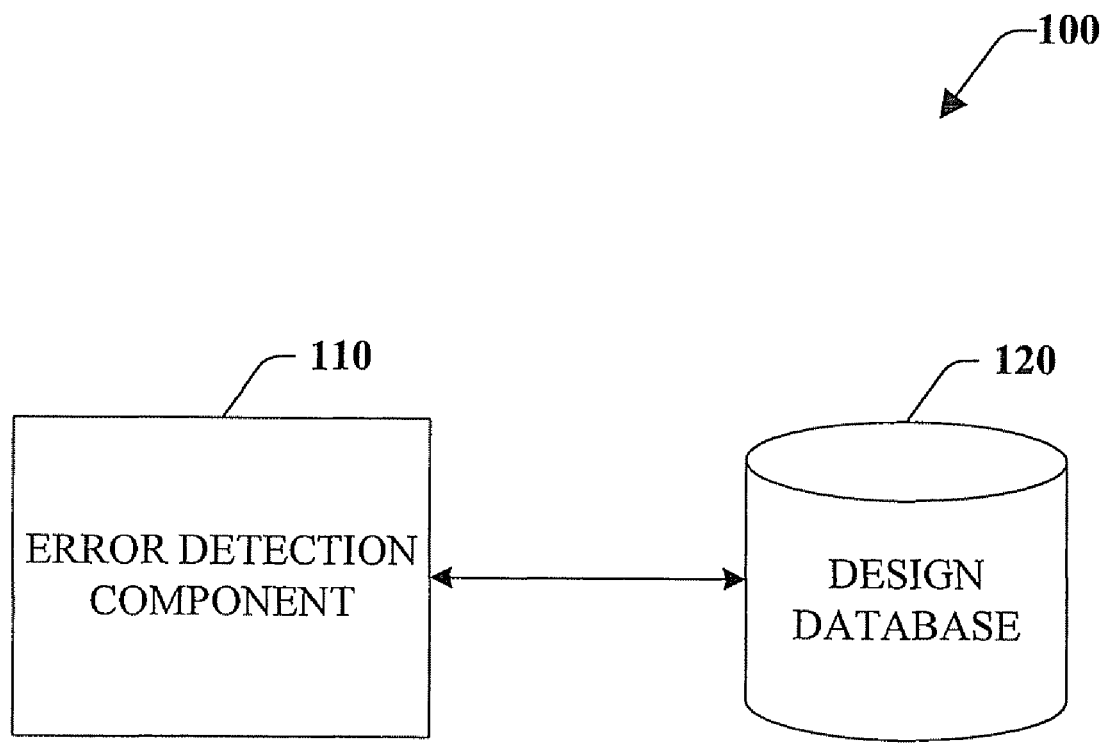
FIG. 1 illustrates a block diagram of a fault detection system in accordance with one aspect of the invention.

The innovation mitigates expensive manual review of semiconductor chip designs for errors associated with bad design practices. Bad design practices may result in silicon chip failure or unnecessary re-masking during fabrication. The innovation improves review of semiconductor chip designs and, consequently, reduces the chance of faults affecting fabrication cost or yields. In particular, the innovation provides efficient detection of long dangling metal faults. A metal routing extending out beyond an acceptable threshold from a metals intersection can result in potential antenna violations, undesired noise, or, in the situation where the dangling metal route is found on a critical signal, circuitry breakdown. A partition component is provided to locate dangling metal routes by scanning an entire semiconductor chip design. The length of each dangling metal route can be checked for compliance with an allowed limit. Dangling metal routes exceeding the limit can be flagged and reported, thus allowing a correction to be made before costly failures.

In one embodiment, a flash memory chip design containing at least about 1.6 million transistors on a 110 nanometer process can be analyzed for dangling metal route faults in under 10 minutes. This is a vast improvement over the several days required for a design engineer to manually review the large chip design. Accordingly, most potential sources of unwanted noise can be eliminated, thus improving chip design and, ultimately, chip performance once fabricated. Additionally, improving the design with respect to curing metal extensions near metal intersections allows additional space for more routing in accordance with good design practices.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

Referring initially to FIG. 1, a fault detection system 100 is illustrated. The system 100 includes an error detection component 110 that facilitates locating errors or faults in a semiconductor chip design. In particular, error detection component 110 facilitates locating dangling or excess metal routing. Dangling or excess metal is an extra length of metal continuing beyond a metal intersection of the chip design. If the extra length is beyond an allowable limit, this bad design can result in poor chip performance or unexpected failure.

The semiconductor chip design can be stored in a design database 120. The design engineer, upon completion of the chip design, may store the completed semiconductor chip design in the design database 120. The error detection component 110 can retrieve the semiconductor chip design from the design database 120. It is to be appreciated that the chip design can be supplied directly to the error detection component 110 as opposed to the error detection component 110 retrieving the chip design from the design database 120.

Once the error detection component 120 retrieves or is supplied with the semiconductor chip design, it can commence reviewing the chip design for dangling metal faults. The error detection component 120 narrows down the chip design and focuses on the metal layers. The metal layers are the layers of the chip which may contain dangling metal defects as those layers contain the metal interconnections required to form electrical circuits within the semiconductor chip device. The error detection component 110 identifies fully connected metal (e.g. both ends connected), floating metal and dangling metal (e.g. one end connected). There could be potentially millions of such features as semiconductor chip designs commonly include millions of transistor devices. Accordingly, the error detection component 110 can identify potential problem areas in a fraction of the time required for a design engineer to manually review the design.

After identifying dangling metal features of the chip design, the error detection component 110 checks each dangling metal features for compliance with acceptable limits. For example, the error detection component 110 can compare the length of the dangling metal feature with a predetermined length limit to verify the dangling metal does not exceed the limit. The predetermined limit can, for example, be configured by a design engineer to a limit appropriate for the particular chip design analyzed by the error detection component 110. Violations of the predetermined limit are flagged by the error detection component 110 and can be corrected by a design engineer while the semiconductor device is still in the design stage. The error detection component 110 repeats the comparison on all dangling metal features present on all metal layers of the chip design. The number of metal layers and, subsequently, the number of dangling metal features is dependent on the complexity of the semiconductor chip design.

Figure 2:
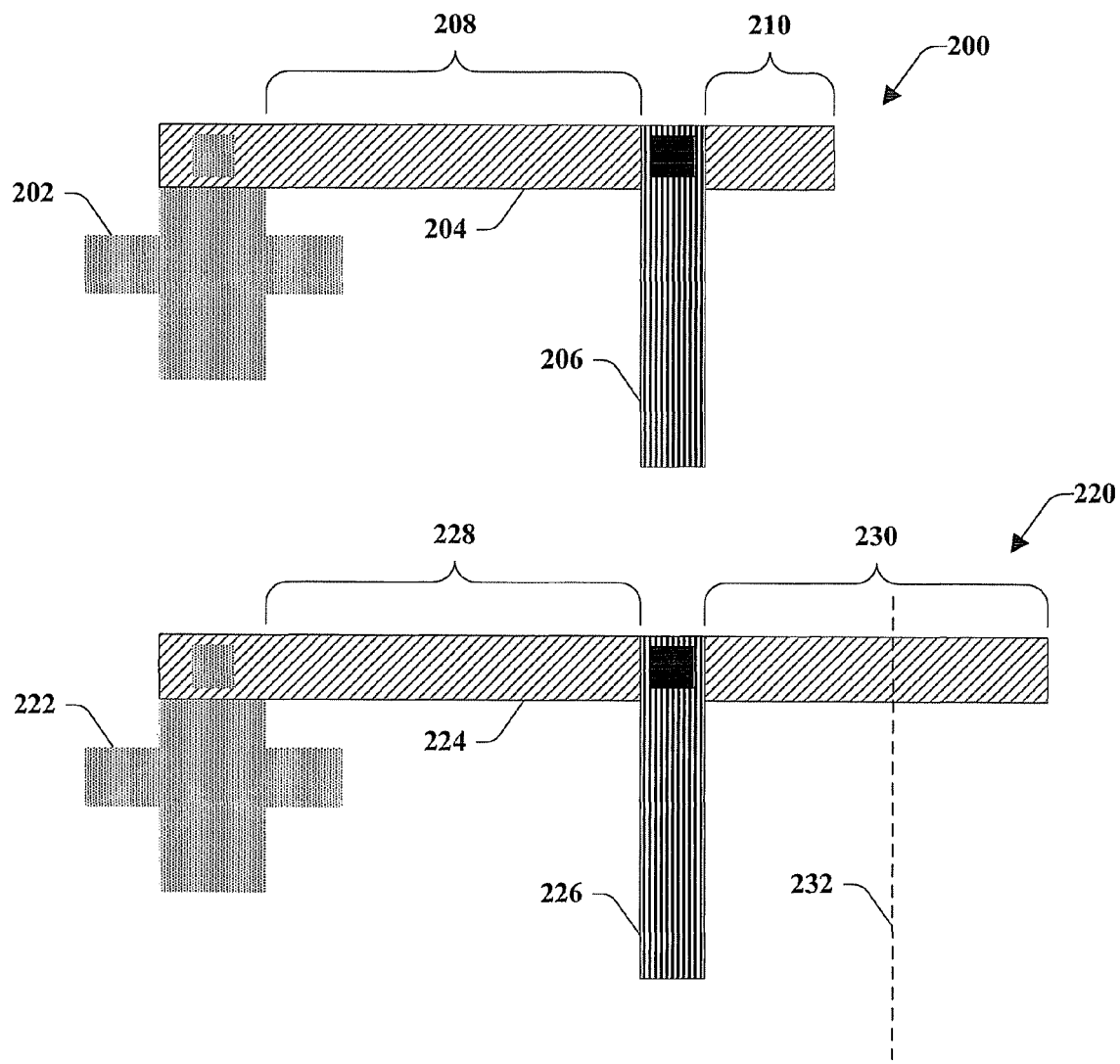
FIG. 2 illustrates exemplary semiconductor chip fragments depicting good and bad design practices.

Turning now to FIG. 2, semiconductor chip design fragments 200 and 220 are depicted. Chip design fragments 200 and 220 illustrate design features and faults applicable for analysis by the error detection component 110 in accordance with an aspect of the subject disclosure. Chip design fragment 200 illustrates an example of good or acceptable design practice. Chip design fragment 200 includes a device gate 202 that enables the desired digital logic operation performed by the semiconductor chip design 200. The device gate 202 can be composed of a polysilicon or other such material. The device gate 202 is operable connected to a first metal portion 204. The first metal portion 204 enables device gate 202 to be interconnected with other device gates (not shown) such that a desired electrical circuit can be created. A second metal portion 206 is operable connected to the first metal portion 204 to enable such interconnection of device gate 202 with other device gates. The second metal portion 206 can be another metal with contact or via component operable to connect metal layers of the chip design. The first metal portion 204 can be described by two lengths 208 and 210. Length 208 is the distance from the connection between the first metal portion 204 and the device gate 202 to the connection between the first metal portion 204 and the second metal portion 206. Length 210 is the distance from the connection between the first metal portion 204 and the second portion 206 to the terminus of the first metal portion 204. Lengths 208 and 210 are typically measured in microns or micrometers (μm). For example, length 208 can be 18 μm in accordance with a particular semiconductor chip design. Additionally, length 210 can be 5 μm. Length 210 is within an allowed limit of dangling metal length. The allowed limit is dependent on the particular semiconductor chip design and the criticality and affordability of the semiconductor device.

Chip design fragment 220 illustrates an example of bad or unacceptable design practice. Chip design fragment 220 includes a device gate 222, similar to device gate 202, which enables the digital or logical function of the semiconductor device. Chip design fragment 220 further includes a first metal portion 224 connected to device gate 222. A second metal portion 226 intersects with the first metal portion 224 to facilitate the creation of an electrical circuit between device gate 222 and other device gates of the complete chip design. As with the first metal portion 204 of chip design fragment 200, the first metal portion 224 can be characterized by two lengths 228 and 230. Length 228 is the separation spanning from the connection of device gate 222 and the intersection of first metal portion 224 and second metal portion 226. Similar to length 208, length 228 is typically measured in microns or micrometers (μm) and may be, for example, 18 μm. Length 230 is the extension of the first metal portion 224 beyond the intersection with the second metal portion 226. Length 230 is depicted longer than length 210 of chip design fragment 110 to illustrate a faulty design. The first metal portion 224 extends beyond an allowed limit 232 and, accordingly, this dangling metal route represented by length 230 may result in undesired noise or potential antenna violations among other things. In accordance with an aspect of the subject disclosure, error detection component 110 is employable to locate and flag poorly designed features such as those depicted by chip design fragment 220.

Figure 3:
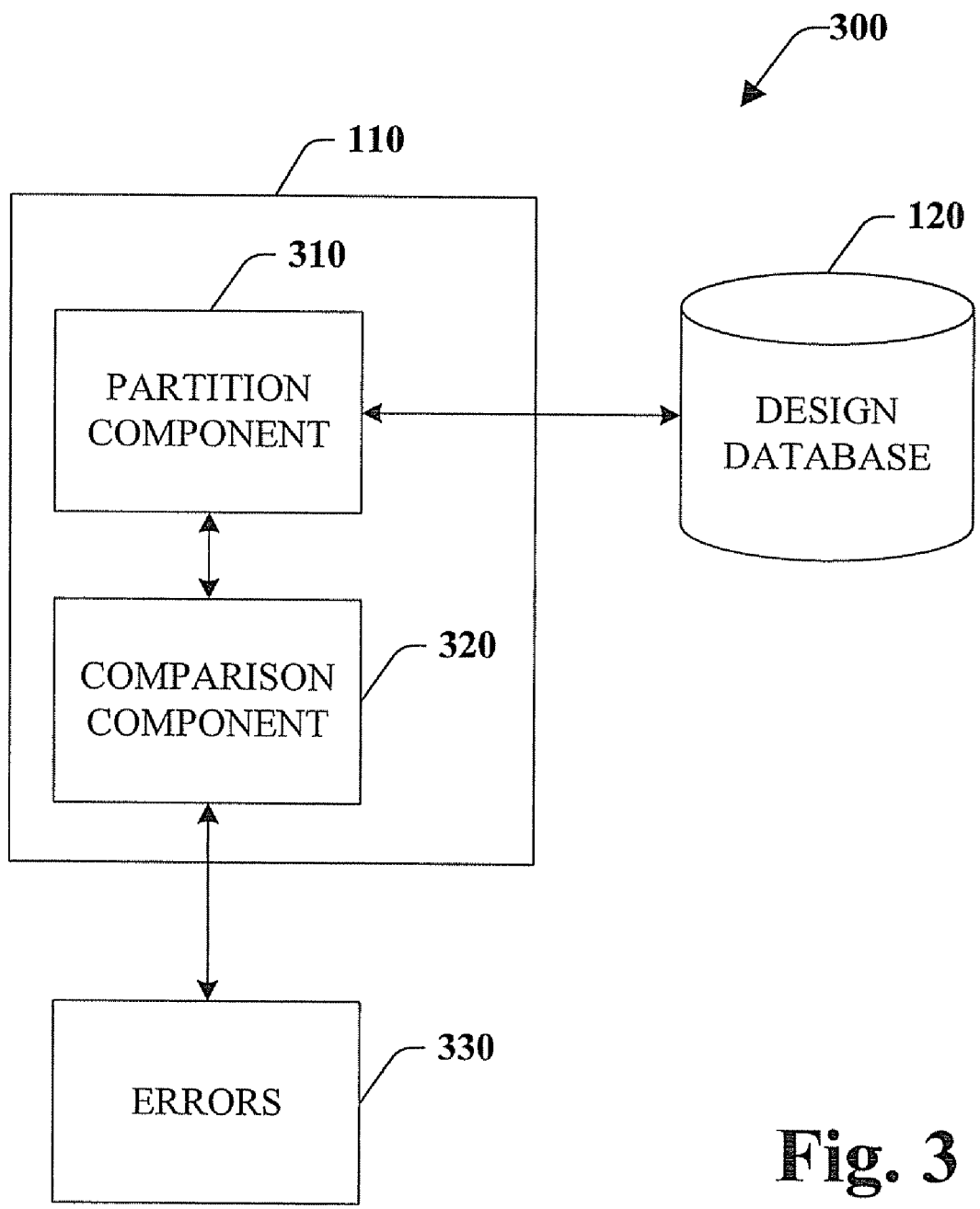
FIG. 3 illustrates a block diagram of a long dangling metal route detection system in accordance with one aspect of the invention.

Referring now to FIG. 3, a semiconductor chip design review system 300 is illustrated according to another aspect of the subject disclosure. System 300 includes error detection component 110 and design database 120. Further, error detection component 110 includes a partition component 310 that receives or retrieves a semiconductor chip design to or from design database 120. The partition component 310 narrows the chip design and directs further analysis to only metal layers. For example, silicon layers that do not include dangling metal routing are striped and ignored by the partition component 310. The partition component 310 further identifies dangling metal routes based at least upon the via-metal intersections. Via-metal intersections are, for example, the interconnections between first metal portion 204 and second metal portion 206 of chip design fragment 200 from FIG. 2.

Error detection component 110 further includes a comparison component 320. Partition component 310 passes the potentially faulty dangling metal routes to the comparison component 320 once the semiconductor chip design is partitioned and the dangling metal routes identified. The comparison component 320 analyzes a dangling metal route to determine if it is a violation. For example, the comparison component 320 compares the length of the dangling metal route against a predetermined route limit. If the dangling metal route length exceeds the limit, as with chip design fragment 220 described with reference to FIG. 2, an error has been detected. The error is flagged and included in a report file of errors 330. It should be appreciated that errors may be flagged and reported by means other than a report file. For example, the errors may be identified on the semiconductor chip design analyzed by the error detection component 110. Further, it should be appreciated that some detected errors may be automatically corrected by the error detection component 110. The comparison component repeats this analysis for each potential fault isolated and identified by the partition component 310. Potential faults could number in the millions depending on the nature and complexity of the semiconductor chip design. Further, while partition component 310 and comparison component 320 are depicted as separate modules, it is to be appreciated that the functionality of the components can be implemented as a single component. For example, partition component 310 can be implemented for both partitioning and comparison. Similarly, comparison component 320 could contain partition component 310 and perform both the identification and analysis functions.

Figure 4:
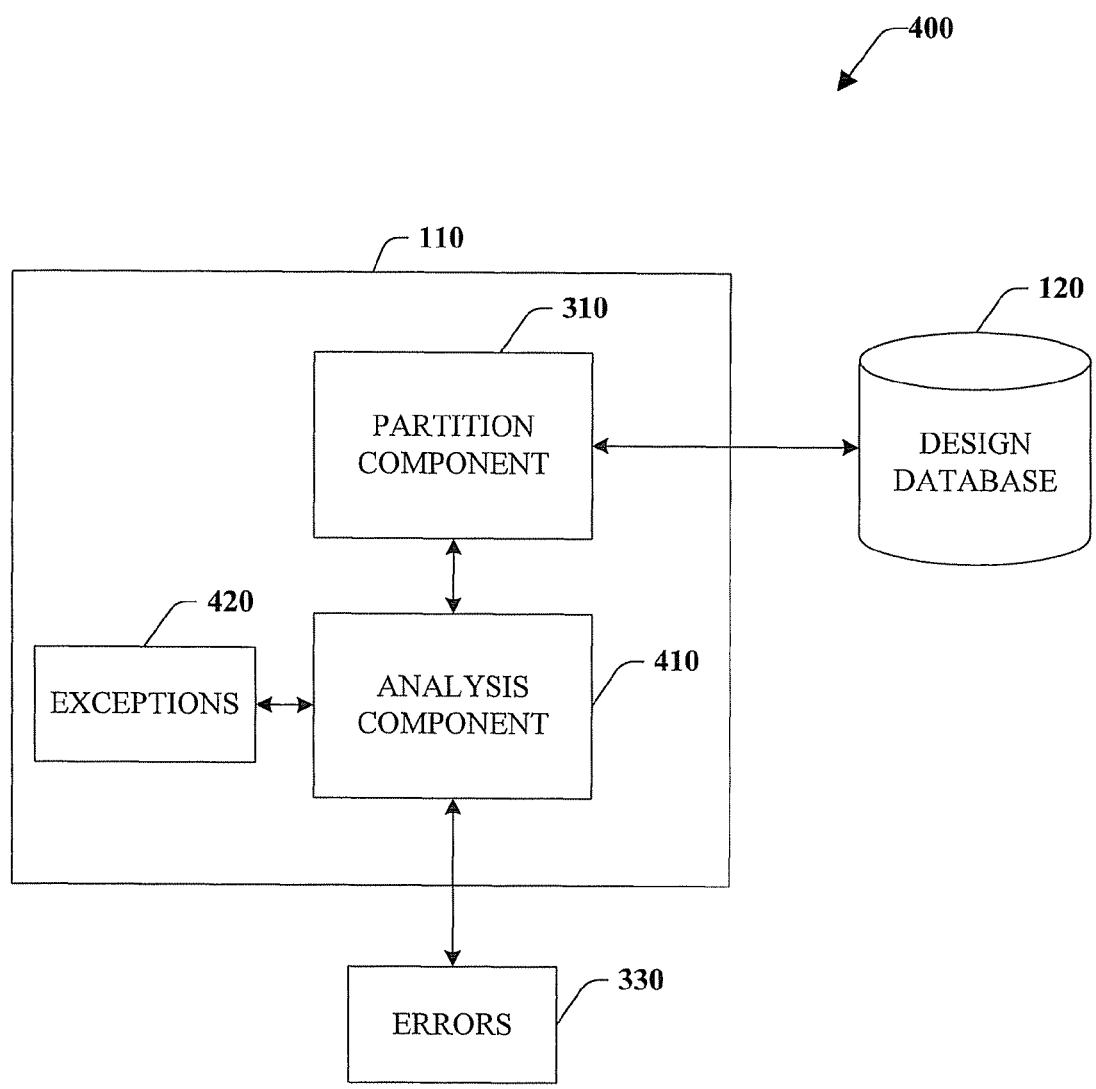
FIG. 4 illustrates a block diagram of chip design fault detection system in accordance with one aspect of the invention.

Turning now to FIG. 4, an error identification system 400 is illustrated in accordance with an aspect of the subject disclosure. System 400 includes design database 120 and a representative error detection component 110. Design database 120 can be, for example, a relational database system. It should be appreciated that design database 120 can be any database system employable to store semiconductor chip design data.

Error detection component 110 includes a partition component 310 and an analysis component 410. Partition component 310 is supplied with or retrieves semiconductor chip designs from design database 120. The partition component 310 focuses on the metal layers of the semiconductor chip design where potentially faulty dangling metal routes reside. The partition component 310 locates potentially faulty routes based at least upon the metal intersections of the design. Once identified, the potential faults are further analyzed by the analysis component 410.

The analysis component 410 analyzes a dangling metal route to determine if it is a violation. For example, the analysis component 410 compares the length of the dangling metal route against a predetermined route limit. If the dangling metal route length exceeds the limit, as with chip design fragment 220 described with reference to FIG. 2, an error may be detected. However, such a dangling metal route may not be a real error. For example, the length of the dangling metal route can be intentional or otherwise be exempted. According to one aspect of the subject disclosure, exceptions 420 can be provided. Exceptions 420 can include, for example, dangling metal routes resulting from spare gate designs intended for future tape-out, automatic placement and routing (APR) cells for top level routing, or the like. Analysis component 410 checks dangling metal routes exceeding the predetermined limit against exceptions 420. Dangling metal routes that do not fall within one of the exceptions 420 is determined to be a real error. Those errors are flagged and included in a report file of errors 330. Other dangling metal routes falling within the exceptions 420 are ignored and not included in errors 330.

Figure 5:
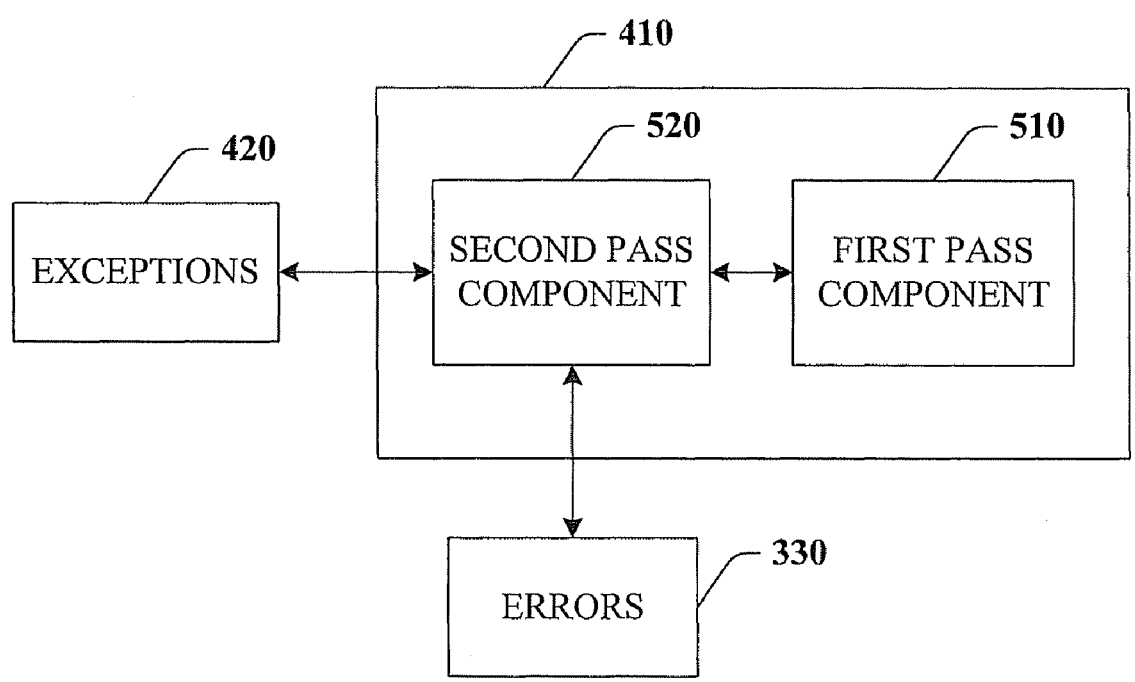
FIG. 5 illustrates a block diagram of a representative analysis component in accordance with one aspect of the invention.

Referring to FIG. 5, a representative analysis component 410 is illustrated according to another aspect of the subject disclosure. Analysis component 410 includes a first pass component 510 and a second pass component 520. First pass component 510 receives or retrieves potentially faulty dangling metal routes from, for example, the partition component 330 described with reference to FIGS. 3 and 4. First pass component 510 checks potentially faulty dangling metal routes to determine whether the route length exceeds a predetermined limit. For example, if a dangling metal route has a length of 15 microns and the predetermined length limit is 10 microns, the first pass component 510 determines that the dangling metal route is a potential violation.

The second pass component 520 checks the potential violations identified by the first pass component 510 to verify the existence of an actual violation. The second pass component 520 utilizes exceptions 420 to determine if the potential violations are exemptions delineated by exceptions 420. Exceptions 420 may include, for example, extra features meant for tape-out at a late stage of design or the like. If none of the exceptions 420 apply to a potential violation, the second pass component 520 elevates the potential violation to an actual violation. The actual violation is recorded in errors 330 to be reported to design engineers responsible for the subject semiconductor chip design. While the first past component 510 and second pass component 520 are depicted as separate components, it is to be appreciated that the components can be implemented as a single component, for example, the analysis component 410 itself. Further, it should be appreciated that the analysis component 410 can be implemented as a one pass system whereby the comparison to the predetermined limit and the determination of the applicability of exceptions 420 occur concurrently.

Figure 6:
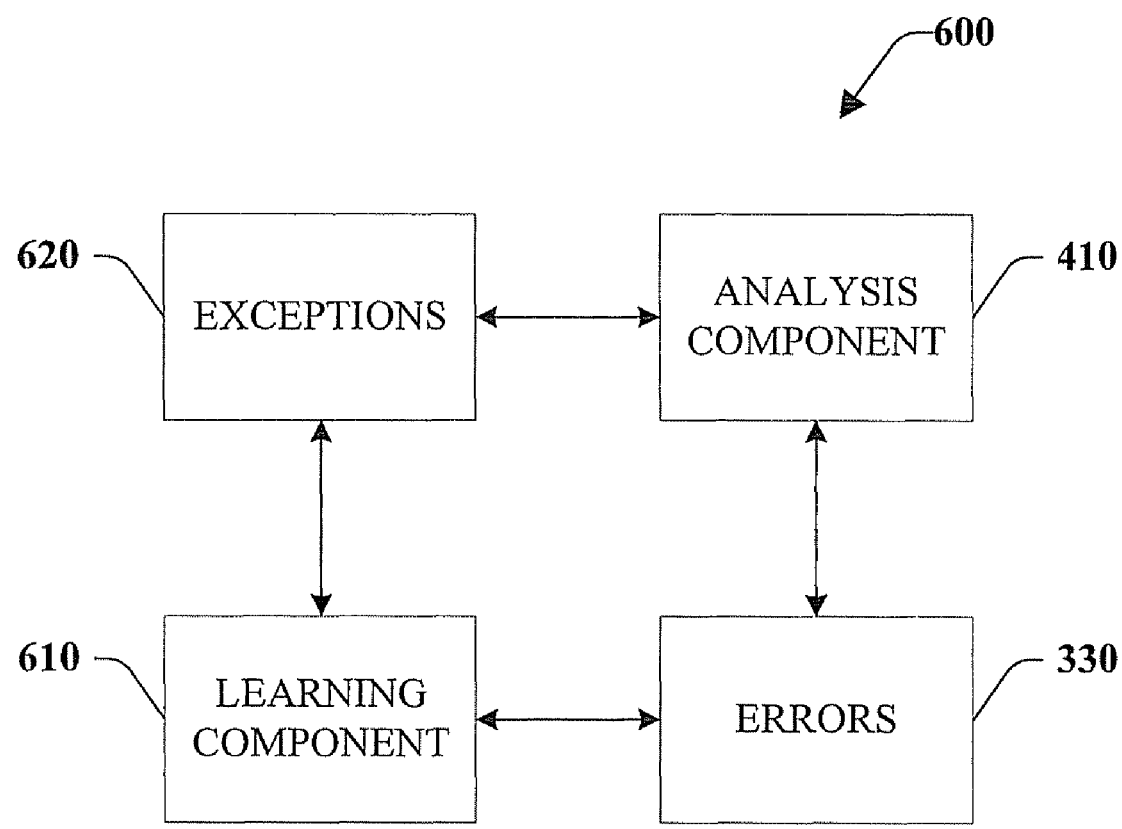
FIG. 6 illustrates a block diagram of a long dangling metal route detection system including a learning component according to one aspect of the invention.

Turning now to FIG. 6, a chip design error detection system 600 is depicted in accordance with another aspect of the subject disclosure. System 600 includes analysis component 410 as described with reference to FIGS. 4 and 5. Analysis component 410 compares dangling metal routes from a semiconductor chip design against a predetermined length limit to discover potential faults. A potential fault is determined when a dangling metal route exceeds the predetermined limit such as the chip design fragment 220 described with reference to FIG. 2. Dangling metal routes that are excessively long can result in unexpected antenna violations, undesired noise, circuitry breakdown and the like. Additionally, analysis component 410 is supplied with exceptions 620. A potential fault may fall within one of the exceptions 620 and, accordingly, determined not to be an actual fault. For example, exceptions 620 may include APR cells for top level routing or the like. Potential faults determined to not fall within one of the exceptions 620 are identified as actual faults and subsequently reported out in a report file of errors 330.

System 600 further includes a learning component 610 according to an aspect of the subject disclosure. A design engineer, reviewing errors 330, may determine that a fault identified by the analysis component 410 should be excused. The learning component 610 receives this feedback from the design engineer and utilized the feedback information to update and refine exceptions 620, thus reducing future false positives. For example, the design engineer may excuse a particular identified fault as being intentional. The learning component 610 can gather information regarding that particular design feature to update and refine exceptions 620. For example, learning component 610 can gather information regarding additional design features surrounding the dangling metal route to determine the context for an intentional limit violation such as that identified by the design engineer.

Learning component 610 may include or consist of artificial intelligence, machine learning or knowledge or rule-based components, sub-components, processes, means, methodologies or mechanisms. For example, learning component 610 may include or implement support vector machines, neural networks, expert systems, Bayesian belief networks, fuzzy logic, data fusion engines, classifiers or the like. Thus, the learning component, employing such techniques, enables the analysis component 410, and subsequently the error detection component 110 to be more adaptive as well as efficient and intelligent.

The aforementioned systems, architectures and the like have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component to provide aggregate functionality. Communication between systems, components and/or sub-components can be accomplished in accordance with either a push and/or pull model. The components may also interact with one or more other components not specifically described herein for the sake of brevity, but known by those of skill in the art.

Furthermore, as with learning component 610, various portions of the disclosed systems and methods may include or consist of artificial intelligence, machine learning, or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, can automate certain mechanisms or processes performed thereby to make portions of the systems and methods more adaptive as well as efficient and intelligent. By way of example and not limitation, the error detection component 110 can utilize such techniques to facilitate provisioning of errors as well as potential corrections to design engineers as a function of context including user, third party and environmental context. For example, the error detection component can infer that an error may be corrected in a particular way as a function of previous corrections by design engineers, and the nature of the offending design feature among other things. Furthermore, such corrections may be pushed to a design engineer or a particular design without explicit/manual initiation by the engineer, for instance as a notification generated as a result of in situ checking as a function of context.

Figure 7:
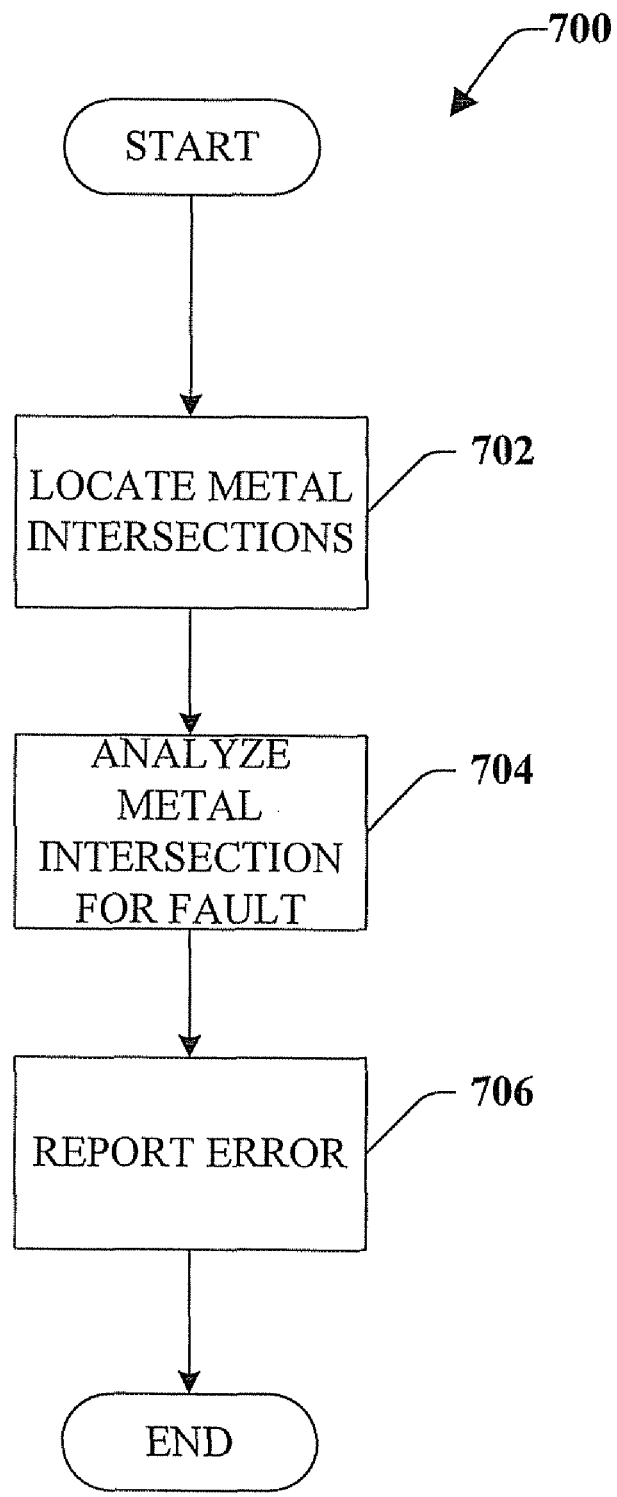
FIG. 7 illustrates a flow chart of a method of detecting faults in a chip layout in accordance with one aspect of the invention.
Figure 8:
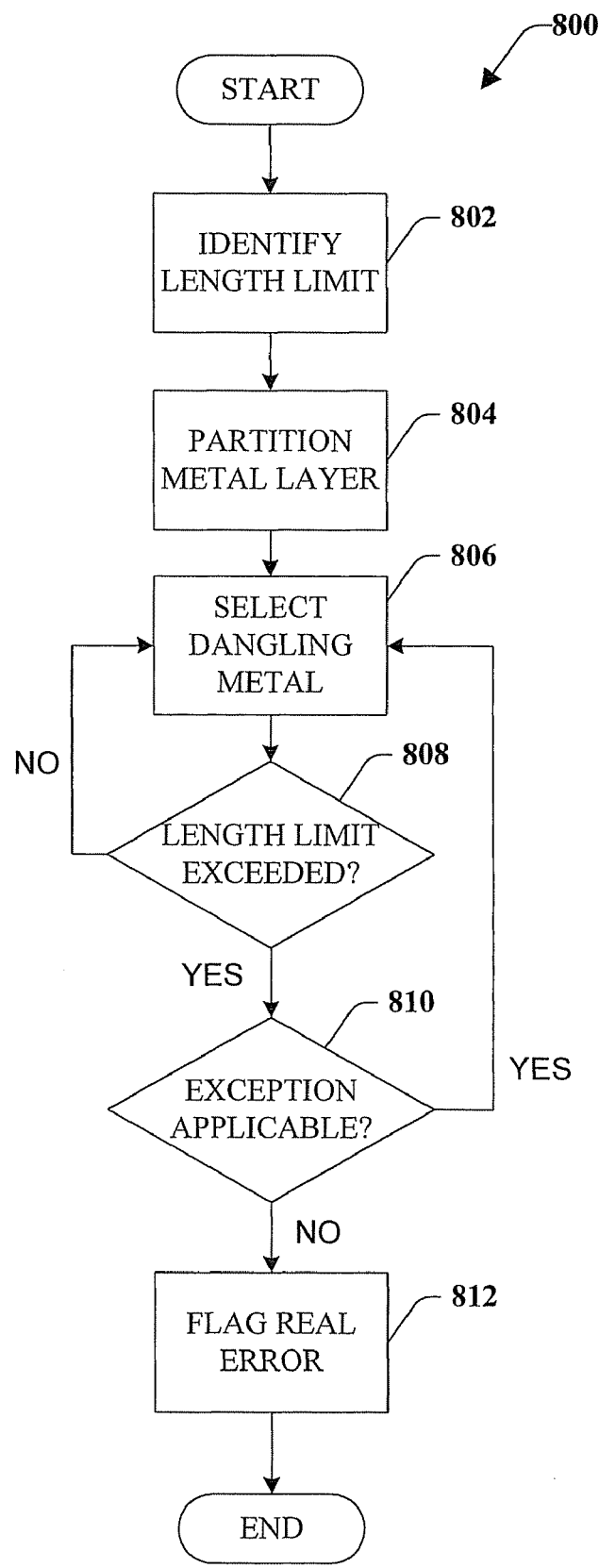
FIG. 8 illustrates a flow chart of a method of identifying erronenous long dangling metal routes in a semiconductor chip design according to one aspect of the invention.
Figure 9:
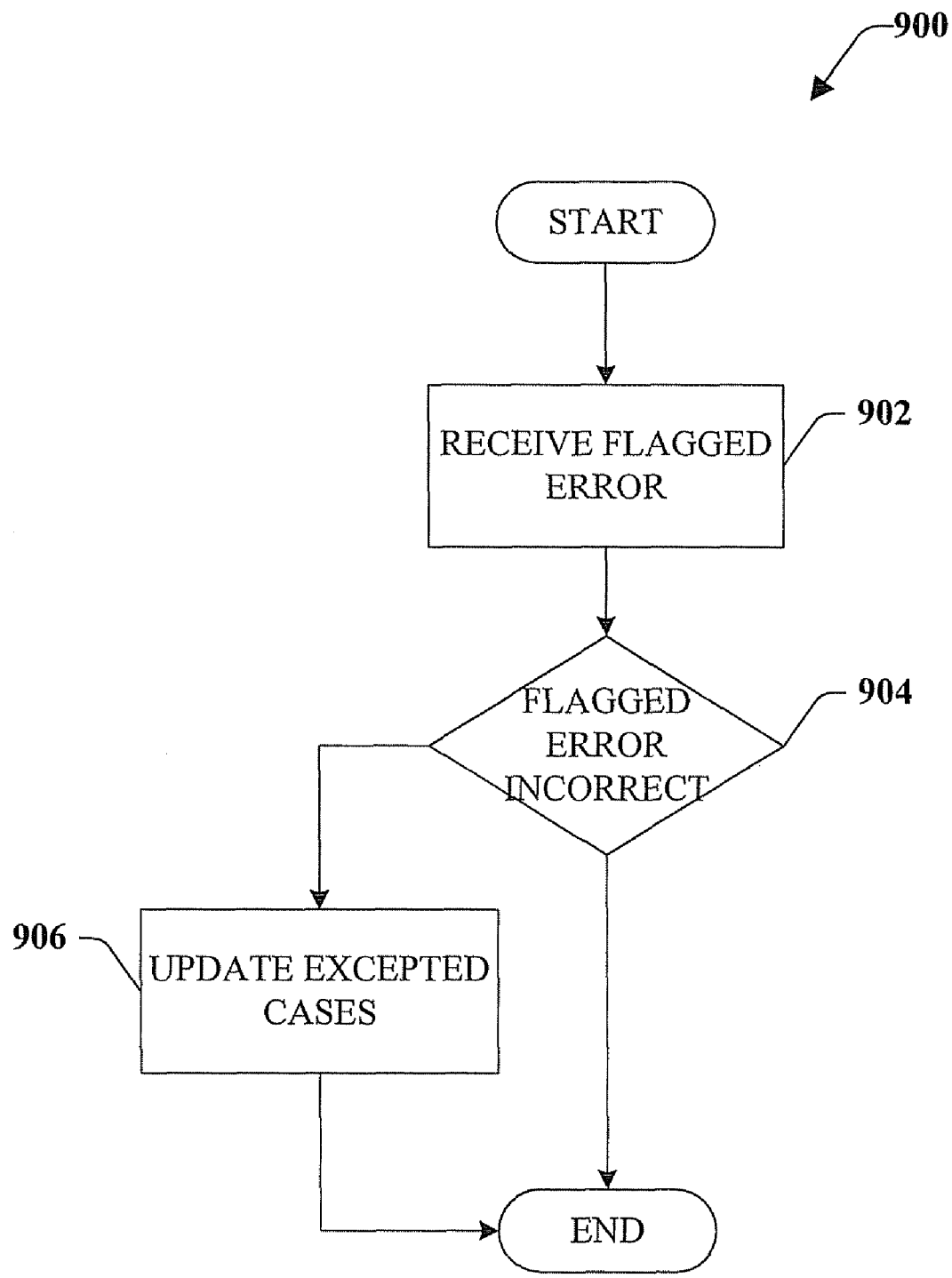
FIG. 9 illustrates a flow chart of a method of refining the fault detection process in accordance with one aspect of the invention.

In view of the exemplary systems described supra, methodologies that may be implemented in accordance with the disclosed subject matter will be better appreciated with reference to the flow charts of FIGS. 7-9. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

Referring to FIG. 7, an exemplary methodology 700 for detecting dangling metal route faults is depicted. At reference numeral 602, metal on metal intersections are located in a semiconductor chip design. Such intersections typically occur only in metal layers of the design and, accordingly, other layers are ignored. Metal-on-metal intersections are areas where potential dangling metal faults may occur. At 704, the metal-on-metal intersection is analyzed to determine if a dangling metal route fault is present. The analysis may include, for example, a comparison between the length of the dangling metal route and a predetermine length limit. At 706, the dangling metal routes exceeding the predetermined limit are flagged as errors and reported out.

Turning now to FIG. 8, a fault detection methodology 800 is provided. At reference numeral 802, the dangling metal route length limit allowed for a particular semiconductor chip design is identified. At 804, the semiconductor chip design is partitioned. The metal layers are focused upon and fully connected metal, dangling metal and floating metal are identified. At 806, a dangling metal route is selected for analysis. At 808, a determination is made as to whether the dangling metal route selected at 806 exceeds the length limit identified at 802. If the limit is not exceeded, flow returns to 806 and another dangling metal route is selected for analysis, if any remain to be analyzed. If it is determined that the limit is exceeded, flow continues to reference numeral 810. At 810, the potential fault identified at numeral 808 is checked a second time to ensure it is an actual fault and not within an exceptional case. If the potential fault is an exception, there is no error and flow returns to numeral 806 and another dangling metal route is selected, if any remain. If it determined that no exceptions apply, an actual error has been identified. At 812, the actual error identified at numeral 810 is flagged and reported.

Turning now to FIG. 9, an intelligent fault detection methodology 900 is provided. At reference numeral 902, a flagged error is received. The error is flagged and reported by a process such as that described with reference to FIG. 8. At 904, a determination is made as to whether the error was incorrectly flagged and should have been an exception. If the error is incorrectly flagged, the exception cases are updated at 906. The exception cases may be refined utilizing artificial techniques. If the error is not incorrectly flagged, the error stays and the flow ends.

As used in this application, the terms "component," "handler," "model," "system," and the like are intended to refer to a computer-related entity, either hardware, a combination of hardware and software, software, or software in execution. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Figure 10:
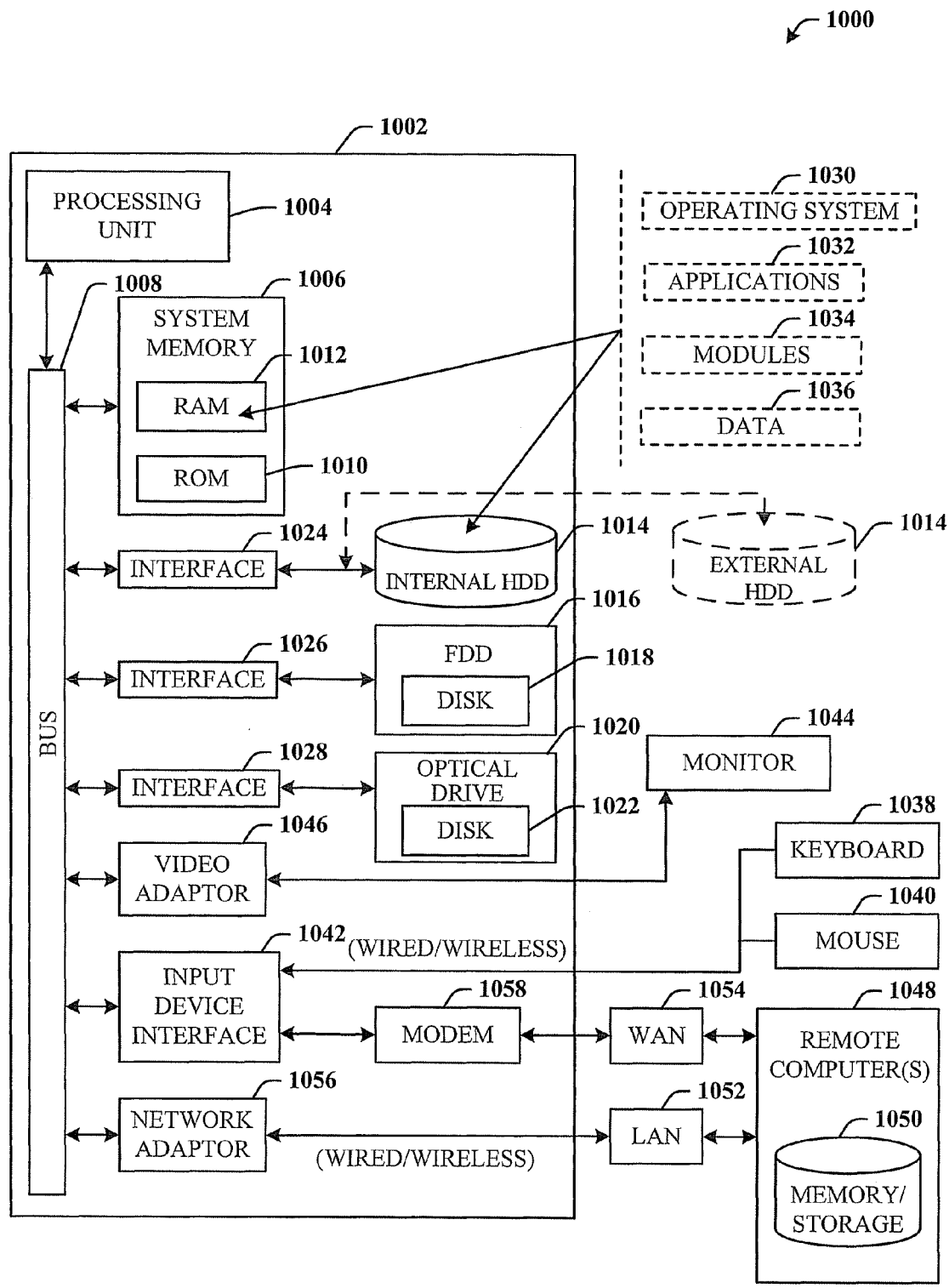
FIG. 10 illustrates a block diagram of a computer operable to execute the disclosed fault detection system.

Referring now to FIG. 10, there is illustrated a block diagram of a computer operable to execute the disclosed profile management architecture. In order to provide additional context for various aspects thereof, FIG. 10 and the following discussion are intended to provide a brief, general description of a suitable computing environment 1000 in which the various aspects of the innovation can be implemented. While the description above is in the general context of computer-executable instructions that may run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and non-volatile media, removable and non-removable media. By way of example, and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

With reference again to FIG. 10, the exemplary environment 1000 for implementing various aspects includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures may also be employed as the processing unit 1004.

The system bus 1008 can be any of several types of bus structure that may further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a non-volatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014 (e.g., EIDE, SATA), which internal hard disk drive 1014 may also be configured for external use in a suitable chassis (not shown), a magnetic floppy disk drive (FDD) 1016, (e.g., to read from or write to a removable diskette 1018) and an optical disk drive 1320, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject innovation.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1002 through one or more wired/wireless input devices, for example, a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 may operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, for example, a wide area network (WAN) 1054. Such LAN and WAN networking environments are commonplace in offices and companies, and facilitate enterprise-wide computer networks, such as intranets, all of which may connect to a global communications network, for example, the Internet.

When used in a LAN networking environment, the computer 1002 is connected to the local network 1052 through a wired and/or wireless communication network interface or adapter 1056. The adaptor 1056 may facilitate wired or wireless communication to the LAN 1052, which may also include a wireless access point disposed thereon for communicating with the wireless adaptor 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with any wireless devices or entities operatively disposed in wireless communication, for example, a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, for example, computers, to send and receive data indoors and out; anywhere within the range of a base station. Wi-Fi networks use radio technologies called IEEE 802.11x (a, b, g, etc.) to provide secure, reliable, fast wireless connectivity. A Wi-Fi network can be used to connect computers to each other, to the Internet, and to wired networks (which use IEEE 802.3 or Ethernet).

Wi-Fi networks can operate in the unlicensed 2.4 and 5 GHz radio bands. IEEE 802.11 applies to generally to wireless LANs and provides 1 or 2 Mbps transmission in the 2.4 GHz band using either frequency hopping spread spectrum (FHSS) or direct sequence spread spectrum (DSSS). IEEE 802.11a is an extension to IEEE 802.11 that applies to wireless LANs and provides up to 54 Mbps in the 5 GHz band. IEEE 802.11a uses an orthogonal frequency division multiplexing (OFDM) encoding scheme rather than FHSS or DSSS. IEEE 802.11b (also referred to as 802.11 High Rate DSSS or Wi-Fi) is an extension to 802.11 that applies to wireless LANs and provides 11 Mbps transmission (with a fallback to 5.5, 2 and 1 Mbps) in the 2.4 GHz band. IEEE 802.11g applies to wireless LANs and provides 20+ Mbps in the 2.4 GHz band. Products can contain more than one band (e.g., dual band), so the networks can provide real-world performance similar to the basic 10BaseT wired Ethernet networks used in many offices.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A fault detection system for discovery of dangling metal route errors in a semiconductor chip design comprising:
    a partition component that separates the semiconductor chip design and identifies potential dangling metal route errors included in the design, wherein a dangling metal route error comprises a portion of a metal route, inadvertently created in the design, that extends from a connection point to a terminus of the metal route and can, by itself, generate a fault; and
    an analysis component that determines, from the potential dangling metal route errors identified by the partition component, actual dangling metal routes, as designed in the semiconductor chip design, that exceed a predetermined limit.

2. The system of claim 1, the predetermined limit is an allowed dangling metal length identified based at least upon the semiconductor chip design.

3. The system of claim 1, the partition component focuses on the metal layers of the semiconductor chip design.

4. The system of claim 1, the analysis component verifies dangling metal routes exceeding the predetermined limit against a predetermined set of exception cases.

5. The system of claim 4 further comprising a learning component that refines the allowable exception cases based at least in part upon feedback on from a user.

6. The system of claim 5, the learning component employs a probabilistic and/or statistical-based analysis to refine the allowable exception cases.

7. The system of claim 1, the analysis component comprises a first pass component and a second pass component.

8. The system of claim 7, the first pass component compares the potential faulty dangling metal routes against the predetermined limit to determine actual faults.

9. The system of claim 8, the second pass component determines the applicability of exception cases to the actual faults determined by the first pass component.

10. The system of claim 9, the second pass component records faults outside the exception cases to a report file.

11. A method of detecting dangling metal faults in a semiconductor layout design comprising:
   locating metal intersections on the semiconductor layout design; and
   analyzing the metal intersections to discover dangling metal route errors created in the design, wherein a dangling metal route error includes a portion of a metal route, inadvertently created in the design, that extends from a connection point to a terminus of the metal route and can, by itself, generate a fault.

12. The method of claim 11, further comprising reporting the discovered faulty dangling metal routes.

13. The method of claim 11, locating metal intersections comprises ignoring non-metal layers of the semiconductor layout design.

14. The method of claim 11, analyzing the metal intersections comprises comparing dangling metal route lengths to a layout specific length limit.

15. The method of claim 11, further comprising verifying faulty dangling metal routes against exception cases to ensure actual violation.

16. The method of claim 15, further comprising providing feedback information on actual violations to identify new exception cases.

17. The method of claim 16, further comprising employing machine learning techniques to refine exceptions cases based at least upon the feedback information.

18. The method of claim 11, further comprising providing a dangling length threshold for the semiconductor layout design above which a metal route is determined to be a fault.

19. A computer-readable medium that implements the method of claim 11.

20. A system of detecting long dangling metal routes in a layout design, comprising:
   means for identifying metal-on-metal intersections within the layout design;
   means for comparing a length of a dangling metal route error, included in the design, to a predetermined limit, wherein the dangling metal route error includes a portion of the metal route, inadvertently created in the design, that extends beyond the metal-on-metal intersections and can, by itself, generate a fault; and
   means for allowing the dangling metal route error when the length is beyond the limit when the dangling metal route error conforms to at least one case from a set of predetermined exceptional cases.

* * * * *